US012619165B2

(12) United States Patent
Guan et al.

(10) Patent No.: US 12,619,165 B2
(45) Date of Patent: May 5, 2026

(54) ELECTROSTATIC HOLDER, OBJECT TABLE AND LITHOGRAPHIC APPARATUS

(71) Applicant: ASML Netherlands B.V., Veldhoven (NL)

(72) Inventors: Tiannan Guan, Eindhoven (NL); Zhuangxiong Huang, Eindhoven (NL); Johannes Bernardus Charles Engelen, 'S-Hertogenbosch (NL); Güneş Nakiboğlu, Eindhoven (NL); Matthias Kruizinga, Veldhoven (NL); Petrus Jacobus Maria Van Gils, Berkel-Enschot (NL); Aldo Tralli, Eindhoven (NL); Sjoerd Frans De Vries, Eindhoven (NL); Marcel Maria Cornelius Franciscus Teunissen, Grathem (NL); Richard Joseph Bruls, Eindhoven (NL); Frits Van Der Meulen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 137 days.

(21) Appl. No.: 18/682,883

(22) PCT Filed: Jul. 13, 2022

(86) PCT No.: PCT/EP2022/069567
§ 371 (c)(1),
(2) Date: Feb. 9, 2024

(87) PCT Pub. No.: WO2023/016738
PCT Pub. Date: Feb. 16, 2023

(65) Prior Publication Data
US 2025/0021022 A1    Jan. 16, 2025

(30) Foreign Application Priority Data

Aug. 12, 2021    (EP) ..................................... 21191135
Oct. 13, 2021    (EP) ..................................... 21202475

(51) Int. Cl.
*G03F 7/00*                (2006.01)

(52) U.S. Cl.
CPC ...... *G03F 7/70708* (2013.01); *G03F 7/70775* (2013.01); *G03F 7/70916* (2013.01)

(58) Field of Classification Search
CPC ............. G03F 7/70708; G03F 7/70775; G03F 7/70916; G03F 7/70908; H01L 21/6833
See application file for complete search history.

(56) References Cited

U.S. PATENT DOCUMENTS 6,628,503 B2 * 9/2003 Sogard .................... G03F 7/707
                                                         361/324
11,521,837 B2 * 12/2022 Koiwa ................ H01L 21/6833
(Continued)

FOREIGN PATENT DOCUMENTS

EP        0 644 578 A2        3/1995
EP        1 241 706 A2        9/2002
(Continued)

OTHER PUBLICATIONS

International Search Report and Written Opinion of the International Searching Authority directed to International Patent Application No. PCT/EP2022/069567, mailed Oct. 11, 2022; 9 pages.
(Continued)

*Primary Examiner* — Hung V Nguyen
(74) *Attorney, Agent, or Firm* — Finnegan, Henderson, Farabow, Garrett & Dunner, LLP

(57)        ABSTRACT
The invention relates to an electrostatic holder comprising: a body, and a clamping element attached to the body, said clamping element comprising an electrode for applying an
(Continued)

attractive force between the clamping element and a first to be clamped object, wherein an outer edge of the body is configured to provide a gap between the outer edge of the body and the first to be clamped object, which gap is configured for outputting a fluid for reducing dust particles reaching the first to be clamped object or a second to be clamped object on an opposite side of the holder.

13 Claims, 8 Drawing Sheets

(56) References Cited

U.S. PATENT DOCUMENTS

| | | | |
|---|---|---|---|
| 2005/0195382 A1* | 9/2005 | Ottens ................. | G03F 7/70783 |
| | | | 355/75 |
| 2011/0222033 A1 | 9/2011 | Ten Kate et al. | |
| 2014/0111781 A1 | 4/2014 | Chang et al. | |

FOREIGN PATENT DOCUMENTS

| | | |
|---|---|---|
| WO | WO 2014/154428 A2 | 10/2014 |
| WO | WO 2020/216555 A1 | 10/2020 |

OTHER PUBLICATIONS

International Preliminary Report on Patentability directed to International Patent Application No. PCT/EP2022/069567, issued Feb. 13, 2024; 6 pages.
Research Disclosure No. 655061, Oct. 23, 2018; 5 pages.
Research Disclosure No. 671059, Feb. 12, 2020; 3 pages.

\* cited by examiner

ELECTROSTATIC HOLDER, OBJECT TABLE AND LITHOGRAPHIC APPARATUS

CROSS-REFERENCE TO RELATED APPLICATIONS

This application claims priority of EP application Ser. No. 21191135.9 which was filed on 12 Aug. 2021 and 21202475.6 which was filed on 13 Oct. 2021 and which are incorporated herein in their entirety by reference.

FIELD

The present invention relates to an electrostatic holder, an object table comprising such an electrostatic holder, and a lithographic apparatus comprising such an object table.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

EUV radiation may easily be absorbed by a gas, so that illumination of a substrate or reticle with EUV radiation is typically carried out in an environment with a gaseous pressure much less than atmospheric pressure, which may be referred to as a vacuum or under vacuum conditions.

A drawback of these conditions is that a perfect vacuum cannot be reached and dust particles coming from elsewhere in the lithographic apparatus may reach a substrate or reticle illuminated by the EUV radiation causing defects in the transferred pattern. This may even result in a non-functional integrated circuit on the substrate.

SUMMARY

Considering the above, it is an object of the invention to provide a lithographic apparatus in which dust particles coming from elsewhere in the lithographic apparatus cause less problems during illumination of a substrate or reticle with EUV radiation.

According to an embodiment of the invention, there is provided an electrostatic holder comprising: a body, and a clamping element attached to the body, said clamping element comprising an electrode for applying an attractive force between the clamping element and a first to be clamped object, wherein an outer edge of the body is configured to provide a gap between the outer edge of the body and the first to be clamped object, which gap is configured for outputting a fluid for reducing dust particles reaching the first to be clamped object or a second to be clamped object on an opposite side of the holder.

According to another embodiment of the invention, there is provided an object table for holding and/or positioning an object, comprising a positioning device for moving the object table in at least one direction, and an electrostatic holder for holding an object, wherein the holder is attachable to the positioning device using attractive forces, wherein the electrostatic holder comprises: a body, and a clamping element attached to the body, said clamping element comprising an electrode for applying the attractive force between the clamping element and the positioning device, wherein an outer edge of the body is configured to provide a gap between the outer edge of the body and the positioning device, which gap is configured for outputting a fluid for reducing dust particles reaching the object on the holder.

According to a further embodiment of the invention, there is provided a lithographic apparatus comprising: an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate, wherein the substrate table is an object table according to the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
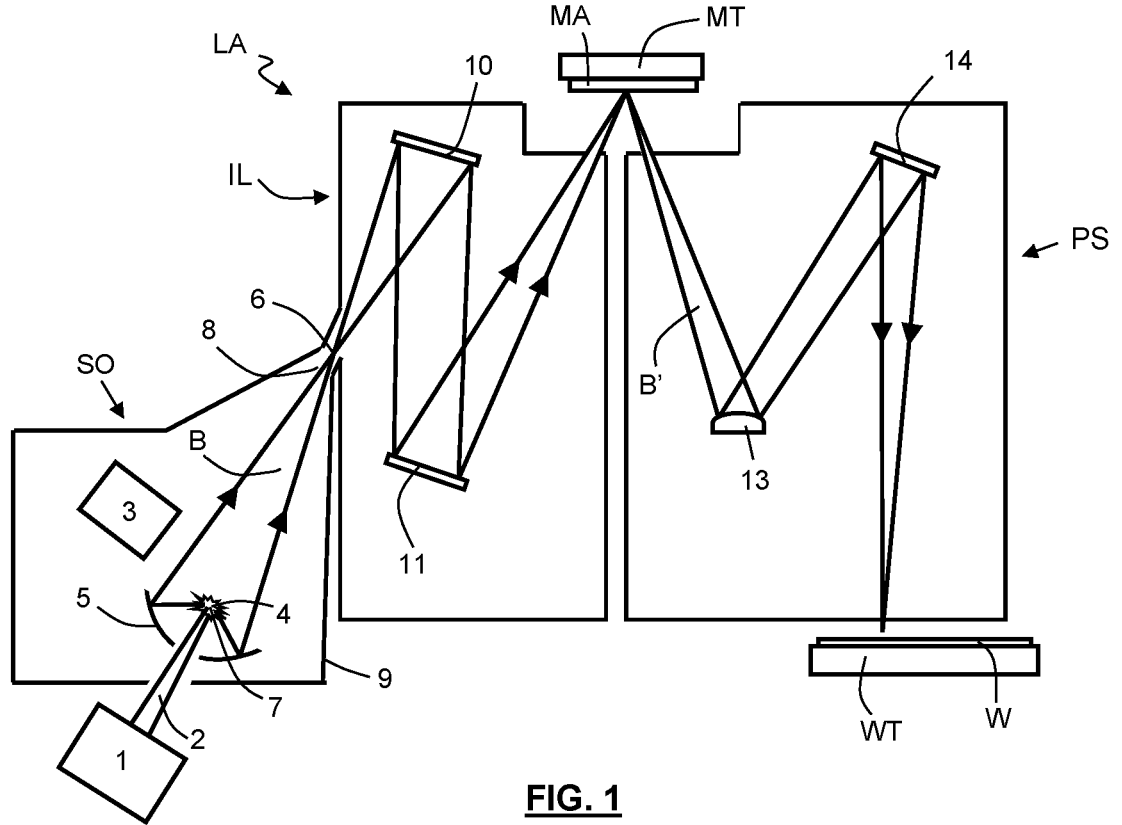
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The substrate table WT and the support structure MT may be examples of object tables configured for holding and positioning an object with the object being a substrate W for the substrate table WT and the object being a patterning device MA for the support structure MT. The substrate table WT and/or the support structure MT may be an object table according to the invention of which an example will be described below by reference to the FIGS. 2-4.

Figure 2:
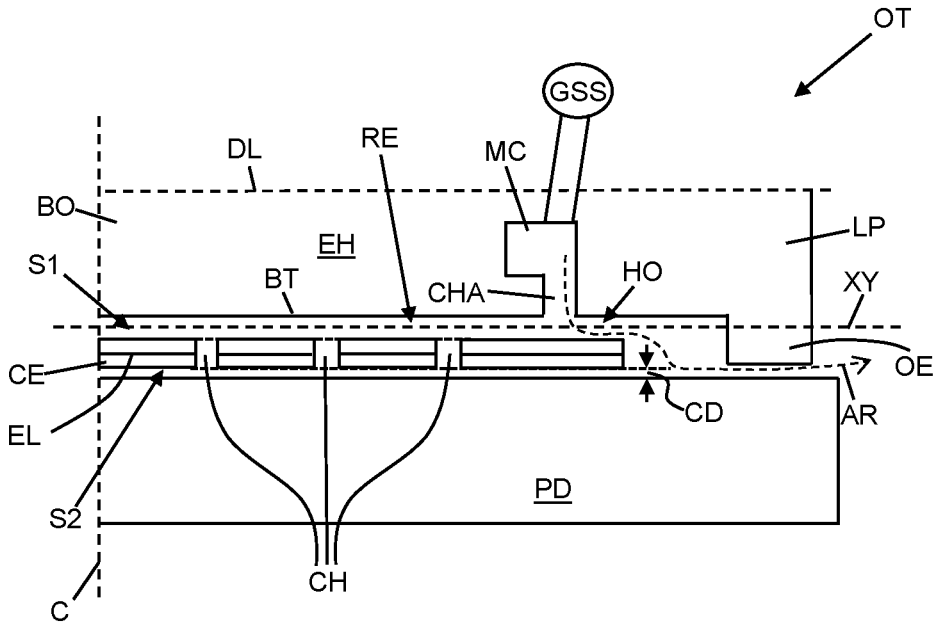
FIG. 2 schematically depicts a first cross-section of an object table according to an embodiment of the invention.
Figure 3:
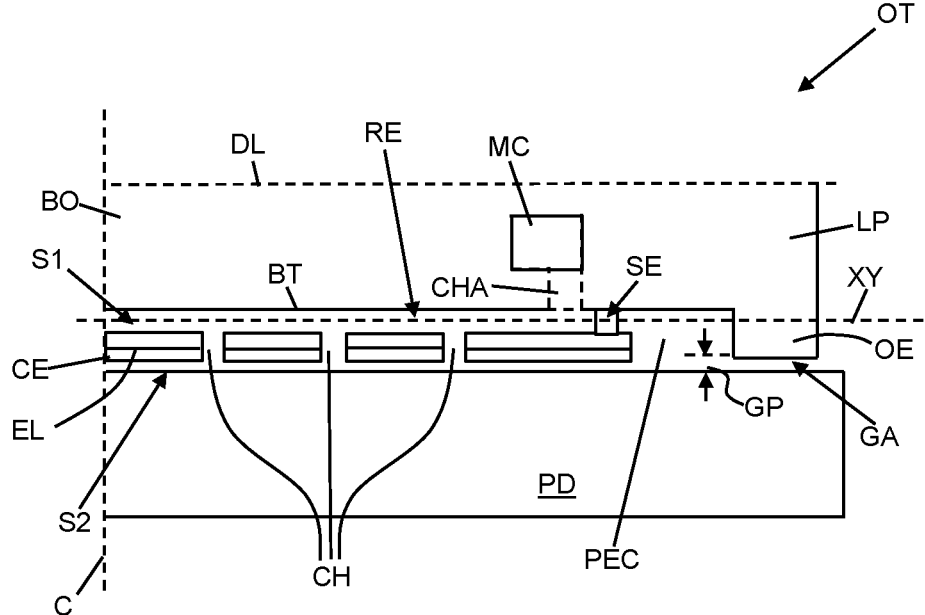
FIG. 3 schematically depicts a second cross-section of the object table of FIG. 2.
Figure 3:
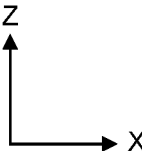
Figure 4:
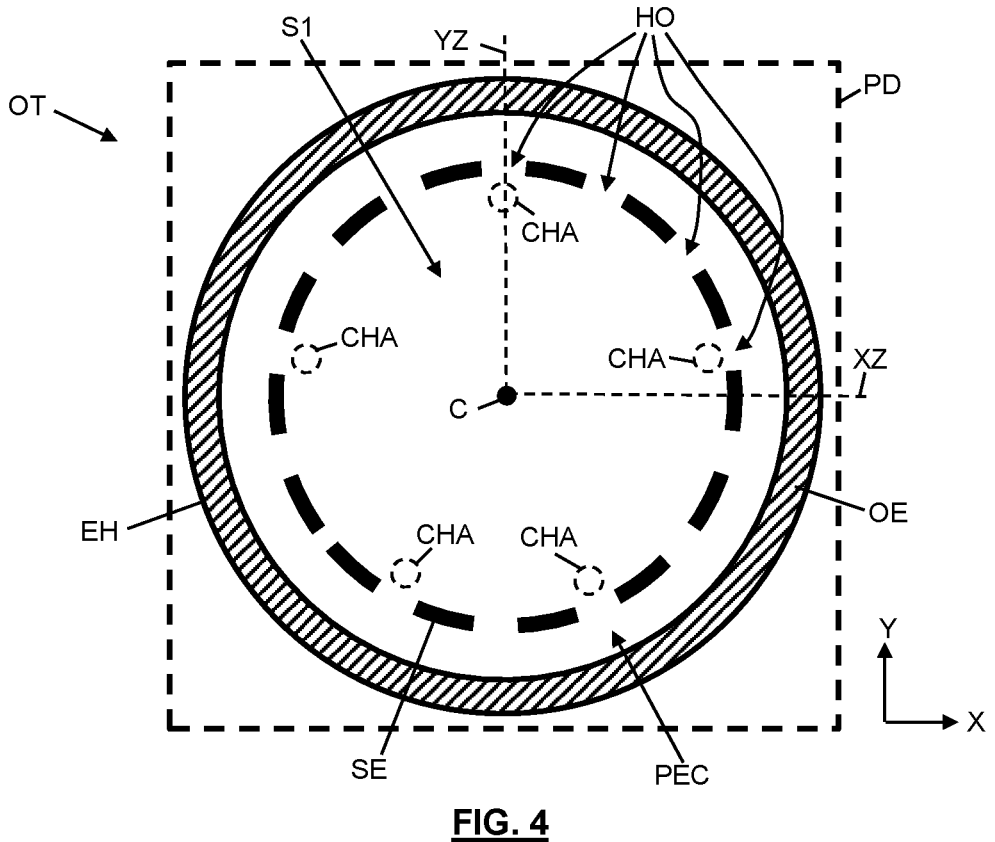
FIG. 4 schematically depicts a third cross-section of the object table of FIG. 2.

FIGS. 2-4 schematically depict different cross-sectional views of an object table OT for holding and positioning an object (not shown but for example a substrate W or patterning device MA, see FIG. 1).

The object table OT includes a positioning device PD for moving the object table OT in at least one direction. In this example, the positioning device PD is configured for moving the object table OT in at least one direction, preferably two orthogonal directions, in the X-Y plane of FIG. 4. The object table OT further comprises an electrostatic holder EH for holding the object. FIG. 4 depicts a dashed line YZ extending from a center C of the electrostatic holder EH in Y-direction and a dashed line XZ extending from the center C in X-direction. The YZ line is representative for the cross-sectional view of the object table OT in the Y-Z plane shown in FIG. 2. The XZ line is representative for the cross-sectional view of the object table OT in the X-Z plane shown in FIG. 3. Both FIGS. 2 and 3 depict an XY line corresponding to the cross-sectional view of the object table OT in the X-Y plane shown in FIG. 4.

The electrostatic holder EH comprises a body BO of which only a lower portion LP is depicted in FIGS. 2-4. The lower portion LP is configured to attach the body BO to the positioning device PD. In FIGS. 2 and 3, a dashed line DL is shown delimiting the lower portion LP. The body BO may further include an upper portion (shown in FIG. 9) attached to the lower portion LP, which upper portion may be configured to hold the object, preferably using attractive forces, e.g. electrostatic forces.

The electrostatic holder EH further comprises a clamping element CE attached to the body BO, wherein said clamping element CE comprises an electrode EL for applying an attractive force, in this case an electrostatic force (or clamping force), between the clamping element CE and the positioning device PD.

In this embodiment, the body BO includes a recess RE for accommodating the clamping element CE. The clamping element CE may be arranged in the recess RE and attached to the body BO such that there is a first space S1 present in between the clamping element CE and the body BO. In other words, the clamping element CE is arranged at a distance from a bottom BT of the recess RE.

The body BO and the clamping element CE may be configured such that there is a second space S2 present in between the clamping element CE and the positioning device PD. To this end, spacers (not shown, may be burls) may extend from a bottom BT of the recess RE through the clamping element CE to the positioning device to keep the clamping element at a clamping distance CD from the clamping element CE without contacting the clamping element CE. The first space S1 and the second space S2 are in fluid communication with each other via channels CH in the clamping element CE. In an embodiment, the spacers extend through channels CH.

The object table OT may include or may be connectable to a gas supply system GSS schematically indicated in FIG. 2, which provides gas to a main channel MC in the lower portion LP of the body BO. The main channel MC is in fluid communication with the first space S1 via channels CHA. The gas supplied to the first and second space may be advantageously used to improve heat transfer between positioning device PD and clamping element CE and/or between clamping element CE and body BO.

The electrostatic holder EH further comprises a seal SE arranged between the bottom BT of the recess RE of the body BO and the clamping element CE to provide a gas barrier at a circumference of the first space S1. In FIG. 4, it can be clearly seen that the seal SE has a ring-shape. The seal SE is provided with a plurality of holes HO. In an embodiment, the plurality of holes HO in the seal SE in total occupy 1-99% of the circumference of the first space S1, more preferably 10-30%.

The recess RE of the body BO is at its circumference delimited by an outer edge OE of the body BO. The outer edge may engage the positioning device, but in this embodiment, the outer edge OE is provided at a gap distance GP thereby providing a gap GA between the outer edge OE and the positioning device PD. The gap GA is in fluid communication with the first space S1 via the plurality of holes HO and a pressure equalizing chamber PEC allowing fluid to flow from the gas supply system GSS via the main channel MC, the channels CHA, the plurality of holes HO, the pressure equalizing chamber PEC to the gap GA in order to output the fluid for reducing dust particles reaching the positioning device PD and/or the object held by the electrostatic holder EH at an opposite side of the positioning device PD as indicated by arrow AR. The positioning device PD has a flat surface opposite the outer edge OE of the body BO. The fluid output has a flow rate in a range between 2 mbar/s and 100 mbar/s, preferably between 5 mbar/s and 50 mbar/s. The dust particles are contaminants and can have an average size in the range of 10 nm-500 um, preferably in the range of 20 nm-100 nm. The contaminants can comprise at least one of carbon, silicon, metal. The fluid can be output radially outwards from the electrostatic holder.

The gap distance GP is preferably larger than the clamping distance CD, but this is not necessary for the invention, and may be constant along the outer edge OE or vary. Such a variation in gap distance may be applied to provide a substantially uniform flow along the outer edge OE. The gap distance at some locations may be zero. In other words, the recess RE at its circumference may provide one or more gaps GA with non-zero gap distance. In an embodiment, the gap GA extends along more than 50%, preferably more than 70%, more preferably more than 80%, and most preferably more than 90% of the outer edge OE. In an embodiment, a maximum gap distance GP is in a range between 20 μm and 500 μm, preferably between 50 μm and 200 μm. A maximum gap distance GP smaller than 20 μm would output a fluid which may be insufficient for reducing dust particles reaching the positioning device PD and/or the object held by the electrostatic holder EH at an opposite side of the positioning device PD.

The pressure equalizing chamber PEC between the plurality of holes HO and the gap GA is configured for distributing the pressure over the gap GA thereby improving the uniformity of the flow outputted by the gap GA. The gap distance GA is preferably such that the gap sufficiently acts as a flow restriction for the pressure equalizing chamber PEC thereby improving the function of the pressure equalizing chamber PEC.

Figure 5:
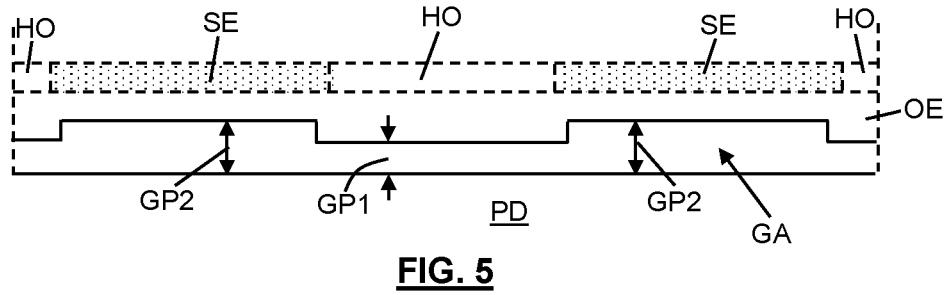
FIG. 5 schematically depicts a side view of a gap between the outer edge of the electrostatic holder and the positioning device of the object table of FIG. 2.

A varying gap distance GP may be implemented using a wave pattern, e.g. a sine wave or a square wave. An example of a square wave is depicted in FIG. 5 showing a side view of the outer edge OE of the electrostatic holder EH including the gap GA between the outer edge OE and the positioning device PD. The gap GA has a square wave pattern with alternating portions defining a minimal gap distance GP1 and a maximum gap distance GP2. In this example, the seal SE with the holes HO has been indicated in dashed lines to show the relation between the seal SE with holes HO and the square wave pattern of the gap GA. In this example, the portions with a minimal gap distance GP1 are arranged opposite a hole HO in the seal. Hence, the portion opposite the hole HO will have a larger flow resistance than the portions at a larger distance from the hole HO thereby aiding in providing a substantially equal fluid flow at both portions. The gap distance GP may also vary in accordance with a sine wave pattern with a trough of the wave pattern being arranged opposite a hole HO in the seal SE.

Figure 6:
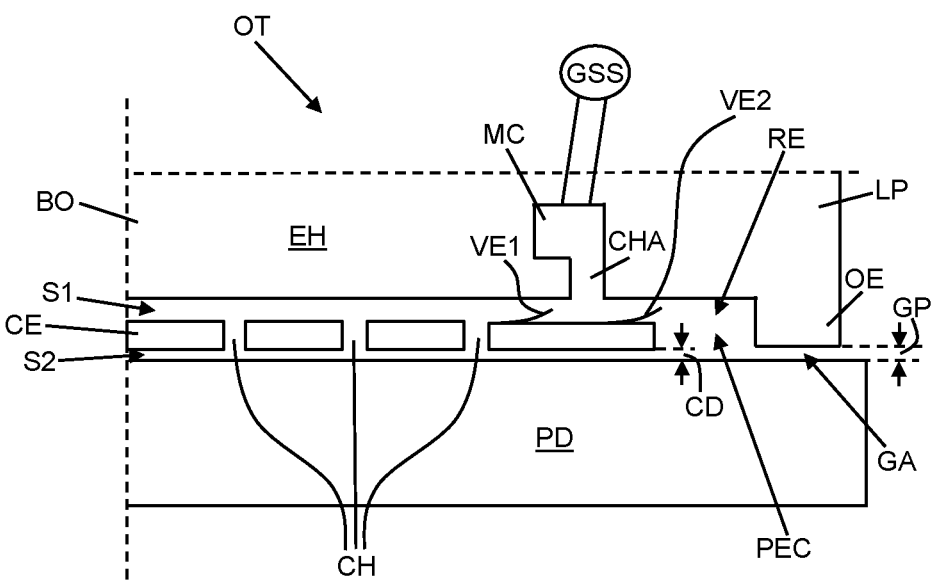
FIG. 6 schematically depicts a cross-section of an object table according to another embodiment of the invention.
Figure 7:
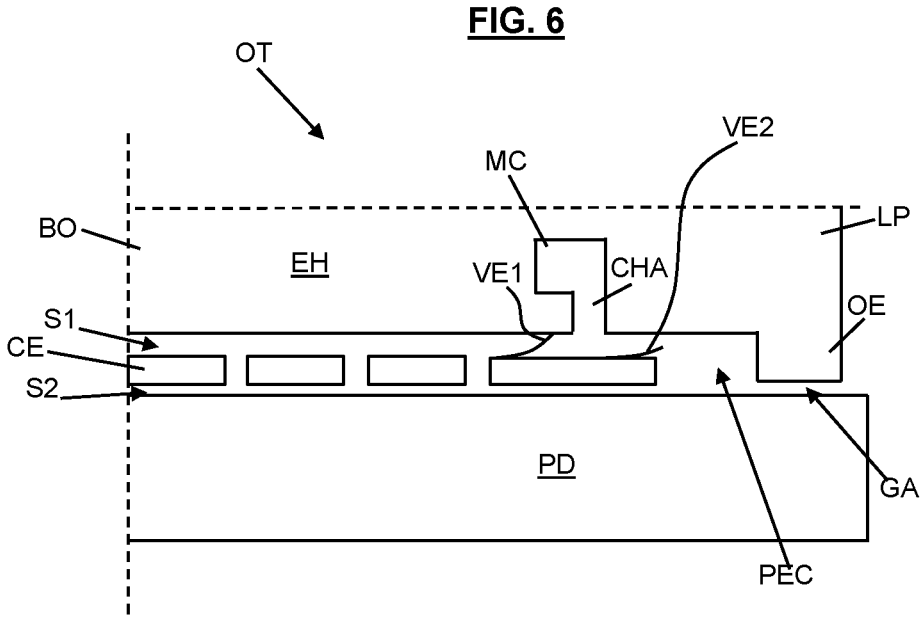
FIG. 7 schematically depicts a cross-section of the object table of FIG. 6.

FIGS. 6 and 7 schematically depict a cross-section of an object table OT according to another embodiment of the invention. The object table OT is similar to the object table of FIGS. 2-4 and the cross-section of FIGS. 6 and 7 correspond to the cross-section of FIG. 2. The description below will focus on the differences between the two embodiments.

FIGS. 6 and 7 depict an electrostatic holder EH with a lower portion LP of a body BO including a recess RE, a main channel MC, a channel CHA, and an outer edge OE, a gas supply system GSS, a positioning device PD, and a clamping element CE with channels CH. A first space S1 is present between the clamping element CE and the body BO and a second space S2 is present between the clamping element and the positioning device PD such that the clamping element CE is at a clamping distance CD from the positioning device PD. A gap GA is present between the outer edge OE and the positioning device PD such that the outer edge is at a gap distance GP from the positioning device. The gap GA is configured for outputting a fluid for reducing dust particles reaching the positioning device and/or an object held by the body BO at an opposite side thereof. The first space S1 and the second space S2 are in fluid communication via the channels CH in the clamping element CE. A pressure equalizing chamber PEC is arranged in the recess RE between the first space S1 and the gap GA. The gas supply system GSS is configured to supply gas to the main channel MC and to the gap GA and/or the first space S1 via the channel CHA.

The embodiment of FIGS. 6 and 7 differs from the embodiment of FIGS. 2-4 in the provision of two valve elements VE1, VE2 around the channel CHA. The valve element VE1, which may alternatively be referred to as inner valve VE1, is arranged between the channel CHA and the space S1 and controls a fluid flow to the first space S1 and thus also the second space S2 as this space is in fluid communication with the first space S1 via the channels CH. The valve element VE1 is an elastic element with a normally-open state, meaning that if no pressure is applied via the gas supply system GSS, the valve element VE1 is open and allows fluid to flow to the first space S1.

The valve element VE2, which may alternatively be referred to as outer valve VE2, is arranged between the channel CHA and the pressure equalizing chamber PEC and thus between the channel CHA and the gap GA and controls a fluid flow to the gap GA. The valve element VE2 is an elastic element with a normally-closed state, meaning that if no pressure is applied via the gas supply system GSS, the valve element VE2 is closed.

The valve elements VE1 and VE2 are configured such that for a first pressure applied by the gas supply system GSS both valve elements are partially open as shown in FIG. 6 and allow fluid flow to respectively the first space S1 and the gap GA, and such that for a second pressure that is higher than the first pressure, the first valve element VE1 is closed and the second valve element VE2 is open as shown in FIG. 7.

When applying the first pressure with both valve elements VE1, VE2 partially open, the pressure in the first and second space S1, S2 is set at substantially the first pressure while at the same time a fluid flow is possible via the gap GA. This situation will be referred to as a high-pressure low-flow-rate configuration.

When applying the second pressure with valve element VE1 closed and valve element VE2, the first and second space S1, S2 are no longer in fluid communication with the channel CHA so that the pressure in these spaces S1, S2 will drop below the first pressure while at the same time a relatively large fluid flow is possible via the gap GA. This situation will be referred to as low-pressure high-flow-rate configuration.

Hence, by applying the abovementioned first and second valve elements, it is possible to use the electrostatic holder in different situations having different requirements with respect to pressure around the clamping element CE and the flow rate for dust-particle shielding.

Figure 8:
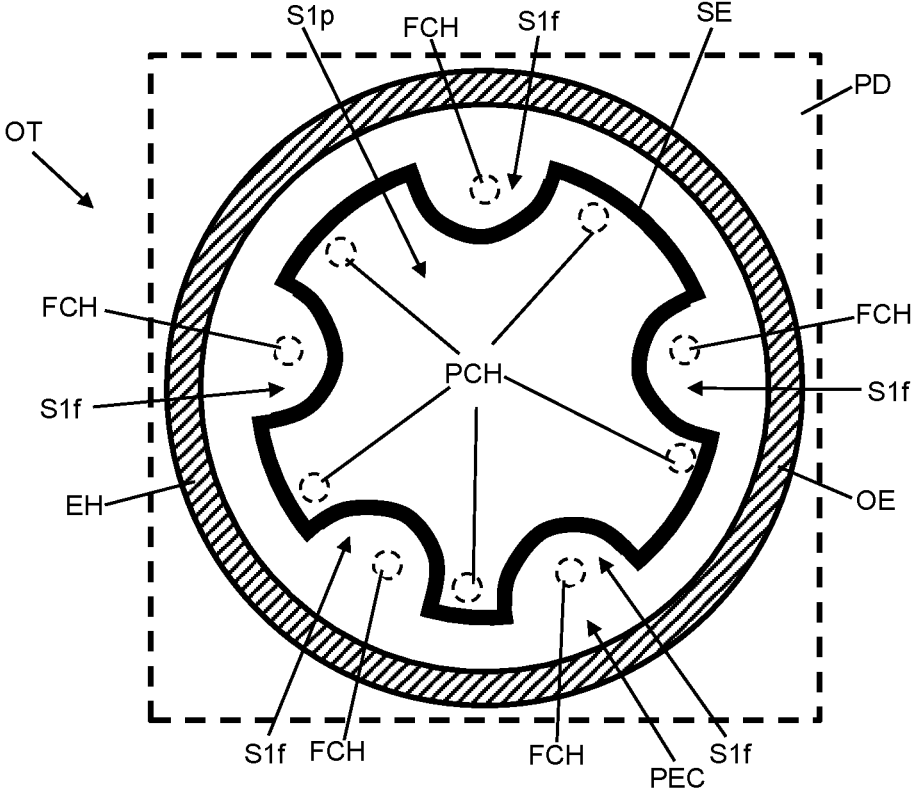
FIG. 8 schematically depicts a cross-section of an object table according to a further embodiment.

FIG. 8 schematically depicts a cross-section of an object table OT according to a further embodiment of the invention. The object table OT is similar to the object tables depicted in FIGS. 2-4 and 6-7, and the cross-section of FIG. 8 corresponds to the cross-section of FIG. 4.

In the embodiment of FIGS. 2-4, the seal SE delimits the first space S1 and provides holes to allow fluid communication between the first space S1 and the gap GA between outer edge OE and the positioning device PD. In the embodiment of FIG. 8, the first space S1 can be divided into a high-pressure subspace S1p and a plurality of high-flow subspaces S1f.

Each high-flow subspace S1f is in fluid communication with a pressure equalizing chamber PEC and thus with the gap GA between the outer edge OE and the positioning device PD. Each high-flow subspace S1f is also in fluid communication with a flow connection FCH to connect the high-flow subspace S1f to a gas supply system.

The high-pressure subspace S1p is in fluid communication with a gas supply system, possibly the same gas supply system to which the flow connections FCH are connected, via pressure connections PCH.

When the high-pressure subspace S1p and the high-flow subspaces S1f are connected to separate gas supply systems, the pressure in the high-pressure subspace and the flow through the gap GA can be set independently from each other allowing to obtain the abovementioned high-pressure low-flow-rate configuration and the low-pressure high-flow-rate configuration of FIGS. 6 and 7 in a different manner.

When the high-pressure subspace S1p and the high-flow subspaces S1f are connected to the same gas supply system, the abovementioned high-pressure low-flow-rate configuration and the low-pressure high-flow-rate configuration of FIGS. 6 and 7 can also be obtained. The high-pressure low-flow-rate configuration can then be obtained by applying a first pressure to both the pressure connections PCH and the flow connections FCH. The low-pressure high-flow-rate configuration can then be obtained by closing the pressure connections, e.g. using a valve or by introducing a removable flow restrictor device in the pressure connections PCH setting the flow resistance to a larger value, preferably a much larger value than a flow resistance in the flow connections FCH, and applying a second pressure, which is higher than the first pressure, to the flow connections FCH.

Figure 9:
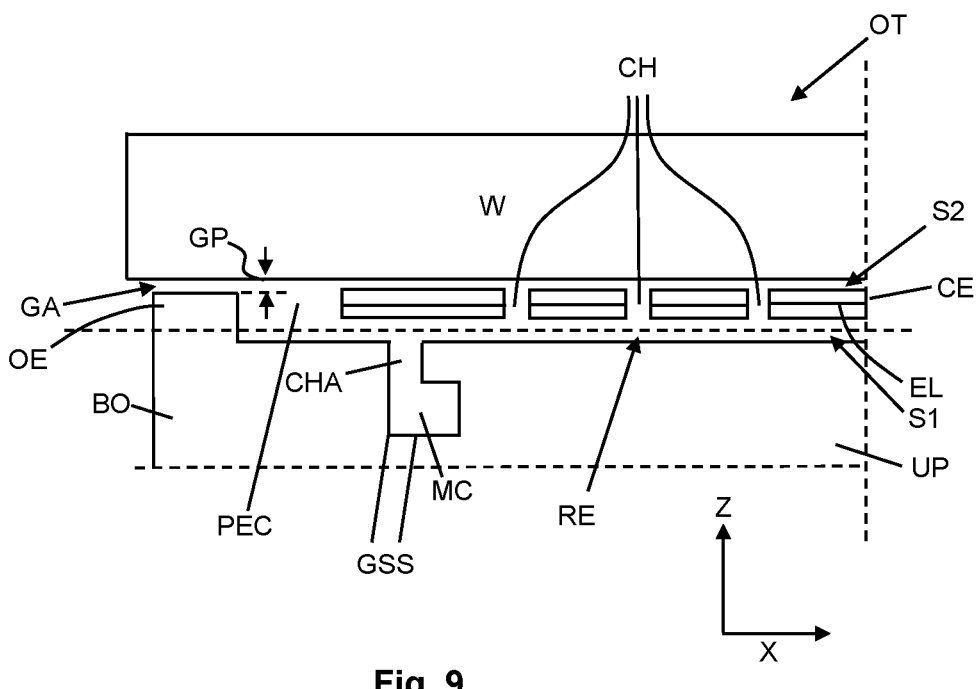
FIG. 9 schematically depicts a cross-section of an object table according to a further embodiment.

FIG. 9 schematically depicts a cross-sectional view of an object table OT for holding and positioning an object according to an embodiment of the invention. It's similar to FIG. 2, but now showing an upper portion UP of the body BO. The upper portion UP is configured to hold the object (the object may be for example a substrate W or patterning device MA), using attractive forces, e.g. electrostatic forces. The features are similar to those in FIG. 2, but mirrored in the X-Y plane. Instead of the positioning device PD of FIG. 2, it's now the object W that defines the gap GA which is between the outer edge OE and the object W. The object W has a flat surface opposite the outer edge OE of the body BO. The fluid output by the gap GA is for reducing dust particles reaching the object W and/or the positioning device PD. The features described in FIGS. 3-8 can also be applied here, mirrored in the X-Y plane.

Figure 10:
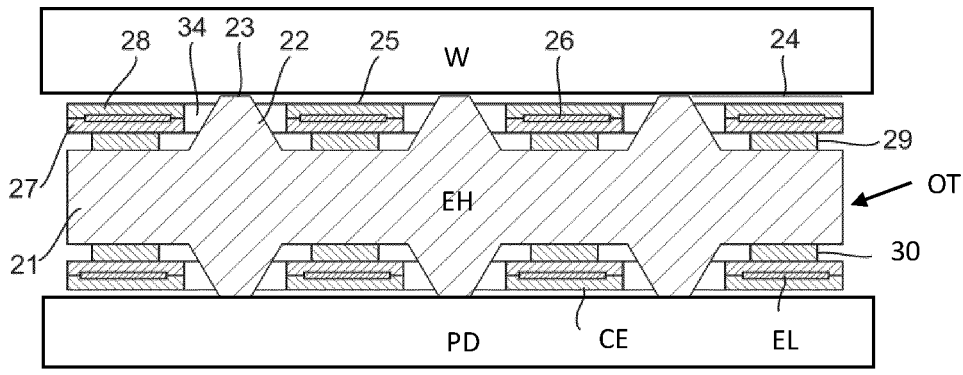
FIG. 10 schematically depicts a cross-section of an object table according to a further embodiment.

FIG. 10 is a schematic cross-sectional view of an object table OT according to an embodiment of the invention. The object table OT comprises an electrostatic holder EH and a positioning device PD. The positioning device PD comprises a recess into which the electrostatic holder EH is held. The electrostatic holder EH is configured to hold an object W relative to the positioning device PD of the object table OT. As shown in FIG. 10, in an embodiment the electrostatic holder EH comprises a body 21. The body 21 is a plate-like disk. The body 21 comprises a plurality of burls 22. The burls 22 are protrusions protruding at the surface of the body 21. The burls 22 have distal ends 23. The body 21 is configured such that the distal ends 23 are in a support plane 24 for supporting the object W. The underside of the object W comes into contact with the distal ends 23 of the burls 22. The position of the underside of the object W corresponds to the support plane 24. The burls 22 are arranged so that the object W lies generally flat on the electrostatic holder EH.

The burls 22 are not shown to scale in FIG. 10. In a practical embodiment, there can be many hundreds, thousands, or tens of thousands, of burls distributed across a electrostatic holder EH of diameter, e.g., 200 mm, 300 mm or 450 mm. The tips of the burls 22 have a small area, e.g. less than 1 mm2, so that the total area of all of the burls 22 on one side of the electrostatic holder EH is less than about 10% of the total area of the total surface area of the electrostatic holder EH. The burl arrangement, which may form a pattern, can be regular or can vary as desired to provide appropriate distribution of force on the object W. The burls 22 can have any shape in plane but are commonly circular in plane. The burls 22 can have the same shape and dimensions throughout their height but are commonly tapered. The burls 22 can project a distance of from about 1 μm to about 5 mm, desirably from about 5 μm to about 250 μm, desirably about 10 μm above the rest of the object-facing surface of the electrostatic holder EH (i.e. the top surface of an electrostatic sheet 25). Hence, the distance between the distal ends 23 of the burls 22 and the top surface of the electrostatic sheet 25 in the vertical direction is from about 1 μm to about 5 mm, desirably from about 5 μm to about 250 μm, desirably about 10 μm. The thickness of the body 21 of the electrostatic holder EH can be in the range of about 1 mm to about 50 mm, desirably in the range of about 5 mm to 20 mm, typically 10 mm.

The body 21 may be made of rigid material. Desirably the material has a high thermal conductivity and a coefficient of thermal expansion that is close to that of the object held. Desirably the material is electrically conductive. Desirably the material has a high hardness. A suitable material includes SiC (silicon carbide), SiSiC (siliconized silicon carbide), Si3N4 (silicon nitrite), quartz, and/or various other ceramic and glass-ceramics, such as Zerodur™ glass ceramic. The body 21 can be manufactured by selectively removing material from a solid disc of the relevant material so as to leave the projecting burls 22. A suitable technique to remove material includes electrical discharge machining (EDM), etching, machining and/or laser ablation. The body 21 can also be manufactured by growing burls 22 through a mask. The burls 22 may be of the same material as the base and can be grown by a physical vapor deposition process or sputtering. In an embodiment, the body 21 comprises one or more internal channels (not shown in the Figures). In an embodiment, the body 21 comprises a plurality of layers that are bonded together. In an embodiment, the layers are formed of different materials. Merely as one example, in an embodiment the core body 21 comprises a layer of SiSiC, a layer of glass and another layer of SiSiC in that order. Other combinations of layers are also possible. The lower part of the electrostatic holder EH facing the positioning device PD comprises a clamping element CE that comprises an electrode EL, similar to FIGS. 2-8.

As shown in FIG. 10, in an embodiment the electrostatic holder EH comprises one or more electrodes 26, EL for an electrostatic clamp. A potential difference may be generated in order to provide an electrostatic clamping force between the object W and the electrostatic holder EH and/or between the electrostatic holder EH and the positioning device PD. In an embodiment, the electrodes 26, EL are encapsulated between dielectric layers (also known as electrical isolation layers) 27, 28. The potential difference generated may be of the order of 10 to 5,000 volts. Arrangements using one or more heaters and temperature sensors to locally control the temperature of a substrate are described in U.S. publication no. 2011-0222033, which is incorporated herein by reference in its entirety and the techniques therein may be applied to the techniques herein.

As shown in FIG. 10, in an embodiment the electrostatic holder EH comprises an electrostatic sheet 25. The electrostatic sheet 25 comprises one or more electrodes 26. For the electrodes 26, in an embodiment two halves of continuous metal film (but isolated from the distal ends 23 of the burls 22) may be separated by a separation distance from each other and deposited to form positive and negative elements of the electrostatic clamp. The separation distance is not particularly limited. In an embodiment the separation distance is at least about 20 μm, optionally at least about 50 μm, optionally at least about 100 μm, optionally at least about 200 μm, and optionally at least about 500 μm. In an embodiment the separation distance is at most about 2 mm, optionally at most about 1 mm, and optionally at most about 500 μm. In an embodiment the separation distance is about 500 μm. There may therefore be two electrodes 26. However, the number of electrodes 26 in the electrostatic sheet 25 is not particularly limited and may be one or three or more. Metal lines of the electrodes 26 may have a layer thickness greater than about 20 nm, desirably greater than about 40 nm. The metal lines desirably have a layer thickness less than or equal to about 1 μm, desirably less than about 500 nm, desirably less than about 200 nm.

The electrode 26 of the electrostatic sheet 25 may be configured to electrostatically clamp the object W to the electrostatic holder EH. The electrode EL of the clamping element CE may be configured to electrostatically clamp the electrostatic holder EH to the positioning device PD.

In an embodiment the material of the body 21 and the burls 22 is electrically conductive. For example, in an embodiment the material of the burls 22 is SiSiC. However, it is not essential for the material of the body 21 and the burls 22 to be electrically conductive. In an embodiment, a grounding layer may be provided that electrically connects the distal ends 23 of two or more of the burls 22 (optionally all of the burls 22) to ground or a common electrical potential. The grounding layer may be formed by depositing a relatively thick layer of a conductive material. The conductive material is not particularly limited. In an embodiment the conductive material is Cr. In an alternative embodiment the conductive material is CrN. In an embodiment the deposited layer is then patterned to form the grounding layer. The pattern may comprise a series of metal lines that connect together distal ends 23 of the burls 22. Such patterns are sometimes referred to as "Manhattan" patterns. In an alternative embodiment the deposited layer is not patterned. In an embodiment the grounding layer or another layer is arranged to cover a surface of the body 21 and/or the burls 22. The grounding layer or other layer can help to smoothen the surface to make it easier to clean the surface.

As shown in FIG. 10, in an embodiment the electrostatic sheet 25 comprises an electrode 26 sandwiched between dielectric layers 27, 28. As shown in FIG. 10, in an embodiment the burls 22 and the electrostatic sheet 25 are provided on both main surfaces of the electrostatic holder EH. In an alternative embodiment, the burls 22 and the electrostatic sheet 25 are provided on only one of the two main surfaces of the substrate holder 20. As shown in FIG. 10, in an embodiment the electrostatic sheet 25 is between the burls 22. For example, as shown in FIG. 10, holes are 34 are provided in the electrostatic sheet 25. The holes 34 are arranged such that their position corresponds to the burls 22 of the core body 21. The burls 22 protrude through respective holes 34 of the electrostatic sheet 25 such that the electrode 26 that is sandwiched between the dielectric layers 27, 28 is provided in the region between the burls 22.

As shown in FIG. 10, in an embodiment the electrostatic holder EH, comprises a bonding material 29, 30. In an embodiment, the bonding material has a thickness of at least 100 nm, for example about 50 μm. The bonding material 29 secures the position of the electrostatic sheet 25 relative to the body 21. The bonding material 30 secures the position of the clamping element CE relative to the body 21. The bonding material 29 keeps the holes 34 in the electrostatic sheet 25 aligned with the burls 22. In an embodiment, the burls 22 are positioned at the center of respective holes 34 of the electrostatic sheet 25.

As shown in FIG. 10, in an embodiment the bonding material 29, 30 is formed in discrete portions that do not connect to each other. There may be some variation in the thickness of the different portions of bonding material 29, 30. In an embodiment, the separate portions of bonding material 29, 30 have substantially the same thickness as each other. The bonding material 29, 30 may be adhesive bonding (e.g. glue) or solder.

Drift or fluctuation in time of the electrostatic force between the electrostatic sheet 25 and the object W or/and between the clamping element CE and the positioning device PD may result in deformation of the object table OT (resulting in negative impact on focus and overlay performances) or/and varying the output of the fluid for reducing dust particles reaching the positioning device PD and the object W. In the description below, the invention will be described in a context of the electrostatic sheet 25, electrode 26, object W and bonding material 29. However, the invention may also apply to the clamping element CE, electrode EL, positioning device PD and bonding material 30.

The drift or fluctuation in time is due to the following two factors. One factor is the relaxation effect of the material (e.g. dielectric material) used in the object table OT after switching electrical polarity of the electrode 26. The other factor is the bonding material 29 volumetric drift. The bonding material 29 may suffer a volumetric drift under mechanical load creep (from clamping force), humidity change (switching between vacuum and atmospheric environment) and service cleaning action on the object table OT (IPA, acetone). The volumetric change of the bonding material 29 may shift the position of the electrostatic sheet 25 with respect to the body 21, BO, hence alter the vacuum gap between the electrostatic sheet 25 and the object W.

The electrostatic force drift or fluctuation may be compensated. The compensation may be achieved by adapting the voltage output to the electrode 26 of the electrostatic sheet 25. Instead of the operation mode of constant voltage applied to the electrode 26, an operation mode of constant electrostatic force may be applied by modulating the voltage applied to the electrode 26 to counter electrostatic force drift or fluctuation during usage. For example, if the original voltage is 2 kV, a modulation of +/−100 V on top of the 2 kV may be applied to the electrode 26. The modulation voltage may be in a range of 1%-10% of the original voltage.

The relaxation effect of the material used in the object table OT may be reduced by the following: 1) feedforward, a relaxation model may be used for prediction based on duration of voltage supplied. 2) feedback, an electrostatic volt meter sensor may be used to measure the electrostatic sheet surface voltage.

The bonding material 29 volumetric drift may be reduced by sensors that measure position of the electrostatic sheet 25. This measurement may be in real time. Then calculate the required voltage to the electrode 26 to achieve a constant electrostatic force. The sensors can be at least one of the following: fiber optics, capacitive distance sensor, metal thin film strain gauge. The sensors can be capacitive sensors formed as part of the electrostatic sheet 25, using high voltage power amplifier as readout circuitry.

A capacitive distance sensor may have a detection resolution of 0.5 nm in a measurement range from few micrometers to 100 micrometers with a sensor area of 50 mm$^2$. The active area of the sensor may be about 10 mm$^2$.

Figure 11:
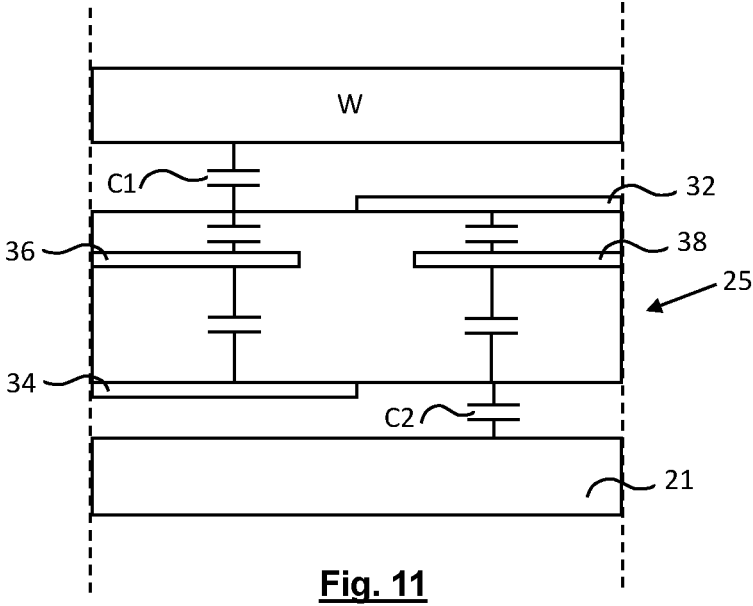
FIG. 11 schematically depicts a cross-section of an object table according to a further embodiment.

The sensor may be integrated into the electrostatic sheet 25 as illustrated in a schematic cross-sectional view of FIG. 11. The electrostatic sheet 25 is between the object W and the body 21. A differential measurement is for common mode noise and long term drift rejection. The electrostatic sheet 25 comprises an electronically conductive grounding layer 32 on an upper outer surface of the electrostatic sheet 25 facing the object W and an electronically conductive grounding layer 34 on an lower outer surface of the electrostatic sheet 25 facing the core 21. The grounding layers 32, 34 may shield electric field. The electrostatic sheet 25 comprises a first sensing electrode 36 and a second sensing electrode 38. The first sensing electrode 36 is located above the electronically conductive grounding layer 34 and is configured to measure a capacitance C1 (between the object W and the upper outer surface of the electrostatic sheet 25) change towards the object W. The second sensing electrode 38 is located below the electronically conductive grounding layer 32 and is configured to measure a capacitance C2 (between the substrate core 21 and the lower outer surface of the electrostatic sheet 25) change towards the core 21. The second sensing electrode 38 may be located above a bonding material plateau of the core 21 which has a well-defined surface and a smaller gap between the second sensing electrode 38 and the core 21 to increase capacitance C2. When the electrostatic sheet 25 moves up or down due to bonding material expand or shrink, C1 and C2 values change, with opposite sign. By taking the values of C1, C2 and C1-C2, a false positive scenario may be avoided and this also increases the detection sensitivity by rejecting common noise. The first and second sensing electrodes 36, 38 may be at the same layer to simplify the manufacturing process. The sensor described above may also be integrated into the clamping element CE of FIG. 10 in a similar way.

Figure 12:
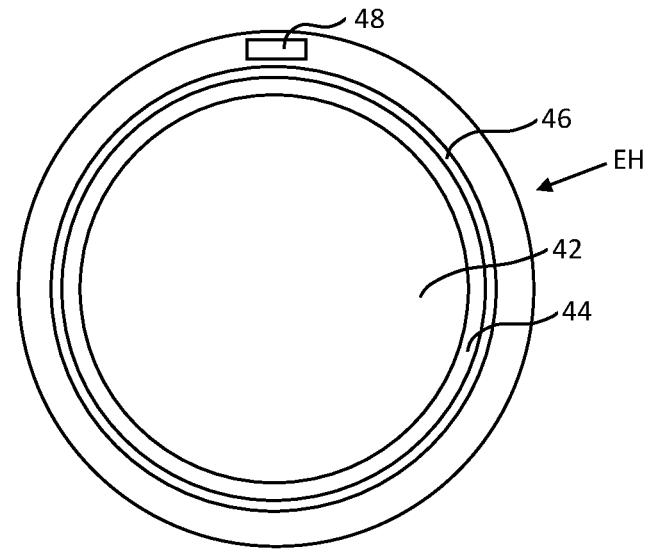
FIG. 12 schematically depicts a cross-section of an object table according to a further embodiment.

FIG. 12 shows schematically in a top view of the electrostatic holder EH the location of the first and second sensing electrodes 46, 48 according to an embodiment. The electrostatic holder EH comprises a burl area 42 that comprises the burls 22 of FIG. 10 facing the object W. The electrostatic holder EH further comprises a seal 44 facing the object W. The seal 44 can have a circular shape. The first sensing electrode 46 may have a (broken) ring shape placed outside the seal 44. The width of the ring may be between 0.01 mm and 1 mm, e.g. around 0.2 mm. The second sensing electrode 48 may be placed outside the first sensing electrode 46. Alternatively one or both of the first and second sensing electrodes 46, 48 may be located inside the burl area 42. Regarding the abovementioned embodiments the fluid/gas generally is more clean that the contamination environment it wants to suppress. Optionally the fluid/gas supply system comprises a particle filtering element upstream of the gap outputting the fluid/gas. Preferential this particle filtering unit is located just upstream of the clamping element.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

CLAUSES

1. An electrostatic holder comprising:
   a body, and
   a clamping element attached to the body, said clamping element comprising an electrode for applying an attractive force between the clamping element and a first to be clamped object, wherein an outer edge of the body is configured to provide a gap between the outer edge of the body and the first to be clamped object, which gap is configured for outputting a fluid for reducing dust particles reaching the first to be clamped object or a second to be clamped object on an opposite side of the holder.

2. An electrostatic holder according to clause 1, wherein the body includes a recess, wherein the clamping element is arranged in the recess and attached to the body such that there is a first space present in between the clamping element and the body, which first space is in fluid communication with the gap between the outer edge of the body and the first to be clamped object, and wherein the first space is connectable to a gas supply system to provide fluid to be outputted via the gap.

3. An electrostatic holder according to clause 2, further comprising a seal arranged between a bottom of the recess of the body and the clamping element to provide a gas barrier at a circumference of the first space, wherein the gap is in fluid communication with the first space via one or more holes in the seal.

4. An electrostatic holder according to clause 3, wherein the one or more holes in the seal in total occupy 1-99% of the circumference of the first space, more preferably 10-30%.

5. An electrostatic holder according to any of the preceding clauses, wherein the gap is connectable to a gas supply system, wherein the electrostatic holder further comprises a pressure equalizing chamber arranged between the gap and the gas supply system, and wherein the gap is configured to act as a flow restriction of the pressure equalizing chamber.

6. An electrostatic holder according to clause 3 and according to clause 5, wherein the pressure equalizing chamber is arranged between the one or more holes in the seal and the gap.

7. An electrostatic holder according to any of the preceding clauses, wherein the gap extends along more than 50%, preferably more than 70%, more preferably more than 80%, and most preferably more than 90% of the outer edge.

8. An electrostatic holder according to any of the preceding clauses, wherein the body and the clamping element are configured such that there is a second space present in between the clamping element and the first to be clamped object with the clamping element being at a clamping distance from the first to be clamped object, and wherein a gap distance between the outer edge of the body and the first to be clamped object at the gap is larger than said clamping distance.

9. An electrostatic holder according to any of the preceding clauses, wherein a gap distance between the outer edge of the body and the first to be clamped object at the gap is substantially constant over the gap.

10. An electrostatic holder according to any of the clauses 1-8, wherein a gap distance between the outer edge of the body and the first to be clamped object at the gap varies over the gap.

11. An electrostatic holder according to clause 10, wherein the gap distance over the gap has a wave pattern, e.g. a sine wave or square wave, with one or more portions defining a minimal gap distance being alternated by one or more portions defining a maximum gap distance.

12. An electrostatic holder according to clause 3 and according to clause 11, wherein a portion defining a minimal gap distance is arranged opposite a hole in the seal.

13. An electrostatic holder according to clause 3, wherein an inner valve is provided at a gas supply system side between each of the one or more holes in the seal and the first space, and wherein an outer valve is provided between each of the one or more holes in the seal and the gap.

14. An electrostatic holder according to clause 13, wherein the inner and outer valves are configured such that with an increasing pressure the inner valve is urged towards a closed position and the outer valve is urged towards an open position.

15. An electrostatic holder according to clause 2, wherein the first space includes a high-pressure subspace and a high-flow subspace, wherein the electrostatic holder further comprises a seal arranged between a bottom of the recess of the body and the clamping element to provide a gas barrier between the high-pressure subspace and the high-flow subspace, wherein the high-pressure subspace and the high-flow subspace are both connectable to the gas supply system, and wherein the gap is in fluid communication with the high-flow subspace.

16. An electrostatic holder according to clause 15, further comprising one or more pressure connections to connect the gas supply system to the high-pressure subspace and one or more flow connections to connect the gas supply system to the high-flow subspace, wherein the one or more pressure connections are provided with removable flow restrictor devices to set a flow resistance in said one or more pressure connections at a larger value than a flow resistance of said one or more flow connections.

17. An electrostatic holder according to any of the preceding clauses, wherein the clamping element is arranged between the body and the to be clamped object.

18. An electrostatic holder according to any of the preceding clauses, wherein the first to be clamped object for which the gap is defined has a flat surface opposite the outer edge of the body.

19. An electrostatic holder according to any of the preceding clauses, wherein the fluid output has a flow rate in a range between 2 mbar/s and 100 mbar/s.

20. An electrostatic holder according to any of the preceding clauses, wherein the gap has a maximum height in a range between 20 um and 500 um.

21. An electrostatic holder according to any of the preceding clauses, further comprising a first sensor configured to measure a position change of the clamping element with respect to the body or/and comprising a second sensor configured to measure a position change of a second clamping element with respect to the body, which second clamping element is for clamping the second to be clamped object.

22. An electrostatic holder according to clause 21, wherein a voltage applied to the electrode is modulated to compensate the position change measured by the first sensor so that the attractive force is kept the same in use or/and wherein a second voltage applied to an electrode of the second clamping element is modulated to compensate the position change measured by the second sensor so that an attractive force for clamping the second to be clamped object is kept the same in use.

23. An object table for holding and positioning an object, comprising:
a positioning device for moving the object table in at least one direction, and an electrostatic holder for holding the object, wherein the holder is attachable to the positioning device using attractive forces, wherein the electrostatic holder comprises:

a body, and a clamping element attached to the body, said clamping element comprising an electrode for applying the attractive force between the clamping element and the positioning device, wherein an outer edge of the body is configured to provide a gap between the outer edge of the body and the positioning device, which gap is configured for outputting a fluid for reducing dust particles reaching the object on the holder.

24. An object table according to clause 18, wherein the electrostatic holder is an electrostatic substrate clamp according to any of clauses 1-17 with the first to be clamped object referred to being the positioning device.

25. An object table according to clause 18 or 19, further comprising a gas supply system to provide the fluid to be outputted via the gap.

26. An electrostatic holder comprising:

a body, and a clamping element attached to the body, said clamping element comprising an electrode for applying an attractive force between the clamping element and a first to be clamped object, a sensor configured to measure a position change of the clamping element with respect to the body.

27. A lithographic apparatus comprising:

an illumination system configured to condition a radiation beam;

a support structure constructed to support a patterning device, the patterning device being capable of imparting the radiation beam with a pattern in its cross-section to form a patterned radiation beam;

a substrate table constructed to hold a substrate; and a projection system configured to project the patterned radiation beam onto the substrate, wherein the substrate table is an object table according to any of the clauses 18-20.

28. A lithographic apparatus comprising:

an illumination system configured to condition a radiation beam;

a support structure constructed to support a patterning device, the patterning device being capable of imparting the radiation beam with a pattern in its cross-section to form a patterned radiation beam;

a substrate table constructed to hold a substrate; and a projection system configured to project the patterned radiation beam onto the substrate, wherein the support structure is an object table according to any of the clauses 18-20.

29. A lithographic apparatus according to clause 21 or 22, wherein the radiation beam includes EUV radiation, and wherein the object table is configured to be operated in vacuum.

The invention claimed is:

1. An object table comprising:

a positioning device configured to move the object table in at least one direction;

an electrostatic holder comprising:

a body comprising a recess and an outer edge that defines a gap between the outer edge and the positioning device;

a clamping element arranged in the recess and attached to the body such that there is a first space between the clamping element and the body, the clamping element comprising an electrode configured to apply an attractive force between the clamping element and the positioning device to clamp the positioning device on a side of the body; and a seal arranged between a bottom of the recess and the clamping element and comprising one or more holes opposite to the outer edge, the seal configured to provide a gas barrier at a circumference of the first space; and a gas supply system configured to provide a fluid to the first space and through the one or more holes in the seal such that the gap outputs the fluid.

2. The object table of claim 1, wherein the electrostatic holder further comprises:

a pressure equalizing chamber arranged between the gap and the gas supply system, and wherein the gap is configured to act as a flow restriction of the pressure equalizing chamber.

3. The object table of claim 2, wherein the pressure equalizing chamber is arranged between the one or more holes in the seal and the gap.

4. The object table of claim 1, wherein a gap distance between the outer edge of the body and the positioning device varies over the gap as determined by a shape of the outer edge.

5. The object table of claim 4, wherein the gap distance over the gap has a wave pattern, a sine wave pattern, or a square wave pattern, with one or more portions of the outer edge defining a minimal gap distance being alternated by one or more portions of the outer edge defining a maximum gap distance.

6. The object table of claim 5, wherein the one or more portions of the outer edge defining the minimal gap distance are arranged opposite corresponding ones of the one or more holes in the seal.

7. The object table of claim 1, wherein:

an inner valve is provided between each of the one or more holes in the seal and the first space, an outer valve is provided between each of the one or more holes in the seal and the gap, and the inner and outer valves are configured such that with an increasing pressure the inner valve is urged towards a closed position and the outer valve is urged towards an open position.

8. The object table of claim 1, wherein:

the first space comprises a high-pressure subspace and a high-flow subspace, the seal is further configured to provide a gas barrier between the high-pressure subspace and the high-flow subspace, the high-pressure subspace and the high-flow subspace are both connectable to the gas supply system, and the gap is in fluid communication with the high-flow subspace.

9. The object table of claim 8, further comprising:

one or more pressure connections to connect the gas supply system to the high-pressure subspace and one or more flow connections to connect the gas supply system to the high-flow subspace, and the one or more pressure connections are provided with removable flow restrictor devices to set a flow resistance in the one or more pressure connections at a larger value than a flow resistance of the one or more flow connections.

10. The object table of claim 1, wherein the positioning device has a flat surface opposite the outer edge of the body.

11. The object table of claim 1, wherein:

an output of the fluid has a flow rate in a range between 2 mbar/s and 100 mbar/s or between 5 mbar/s and 50 mbar/s, or/and the gap has a maximum height in a range between 20 um and 500 um or between 50 um and 200 um.

12. The object table of claim 1, further comprising:

a first sensor configured to measure a position change of the clamping element with respect to the body; or/and a second sensor configured to measure a position change of a second clamping element with respect to the body, wherein the second clamping element is configured to hold an object on an opposite side of the body from the side with the positioning device.

13. A lithographic apparatus comprising:

an illumination system configured to condition a radiation beam;

a support structure constructed to support a patterning device, the patterning device being capable of imparting the radiation beam with a pattern in its cross-section to form a patterned radiation beam;

a substrate table constructed to hold a substrate; and a projection system configured to project the patterned radiation beam onto the substrate, wherein the substrate table comprises the object table according to claim 1, or/and wherein the support structure comprises the object table according claim 1.

\* \* \* \* \*